United States Patent [19]

Testi et al.

[11] Patent Number: 4,887,043
[45] Date of Patent: Dec. 12, 1989

[54] PHASE SHIFTER-EQUALIZER CIRCUIT

[75] Inventors: Termano Testi, Monza; Gabriele Merli, Cassano D'Adda, both of Italy

[73] Assignee: GTE Telecomunicazioni, S.p.A., Cassina de Pecchi, Italy

[21] Appl. No.: 927,483

[22] Filed: Nov. 6, 1986

[30] Foreign Application Priority Data

Nov. 15, 1985 [IT] Italy .............................. 22867 A/85

[51] Int. Cl.$^4$ .......................... H03H 5/00; H03K 5/13
[52] U.S. Cl. ..................................... 328/155; 307/262; 333/28 R
[58] Field of Search ............... 307/262, 511, 282, 513; 328/155, 133; 333/138–140, 167, 172, 177, 178, 18, 28 R; 363/156

[56] References Cited

U.S. PATENT DOCUMENTS

| | | | |
|---|---|---|---|
| 3,322,970 | 5/1967 | Batteau | 307/511 |
| 3,509,481 | 4/1970 | Halsey | 333/28 R |
| 3,546,604 | 12/1970 | White | 328/155 |
| 3,628,162 | 12/1971 | Lunden | 307/511 |
| 3,849,676 | 11/1974 | Bareyt | 307/511 |
| 3,868,604 | 2/1975 | Tongue | 333/28 R |
| 4,273,963 | 6/1981 | Seidel | 333/28 R |

FOREIGN PATENT DOCUMENTS

| | | | |
|---|---|---|---|
| 1293232 | 3/1968 | Fed. Rep. of Germany | 333/28 R |
| 0047717 | 4/1980 | Japan | 307/511 |
| 0117811 | 6/1985 | Japan | 328/155 |

*Primary Examiner*—John S. Heyman
*Assistant Examiner*—Timothy P. Callahan
*Attorney, Agent, or Firm*—David N. Caracappa

[57] ABSTRACT

This invention covers a phase shifter-equalizer circuit including a purely resistive impedance, a purely reactive impedance, at least one of which adjustable, and a phase inverter device, which permit to adjust in a continuous way the phase between the output current and the input current, while maintaining the amplitude of the output current constant and substantially equal to the amplitude of the imput current versus phase and group delay variations between the two currents. Furthermore, continuous phase adjustment is achieved by adjusting one only parameter of the circuit.

9 Claims, 3 Drawing Sheets

FIG. 1
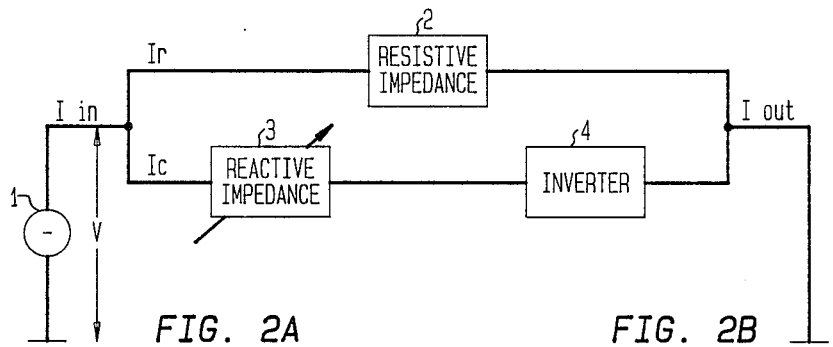
FIG. 2A FIG. 2B
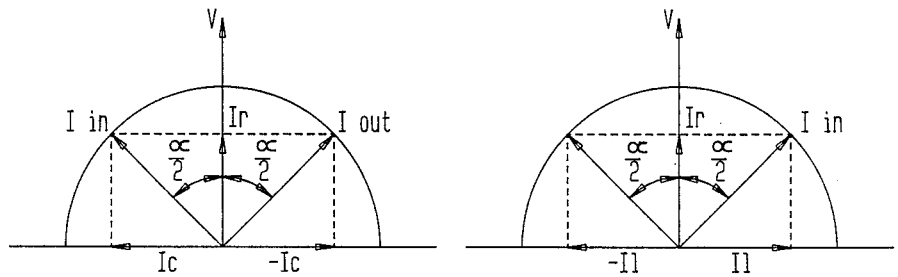
FIG. 3
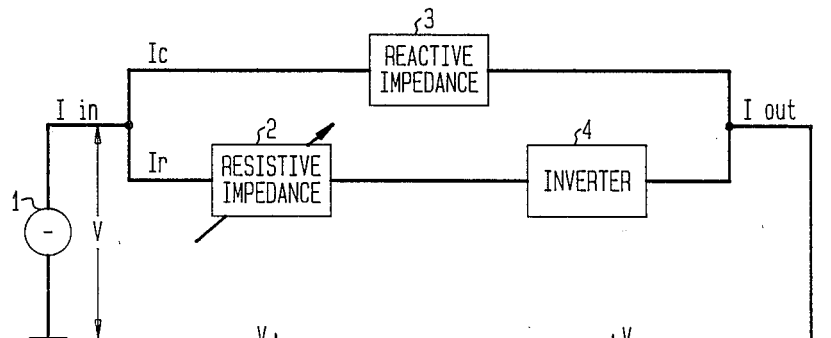
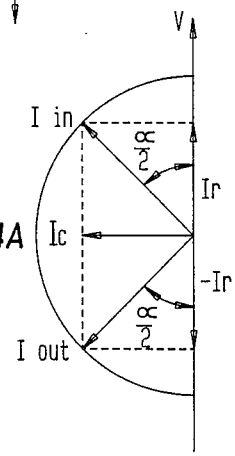
FIG. 4A
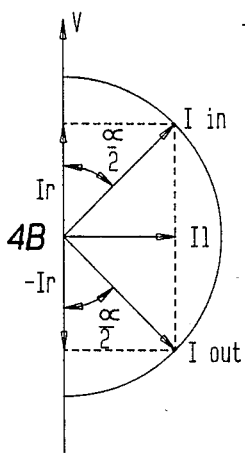
FIG. 4B FIG. 9
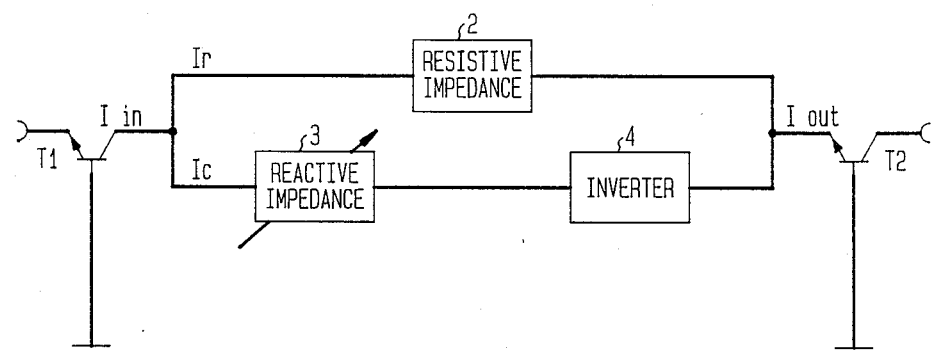
FIG. 10
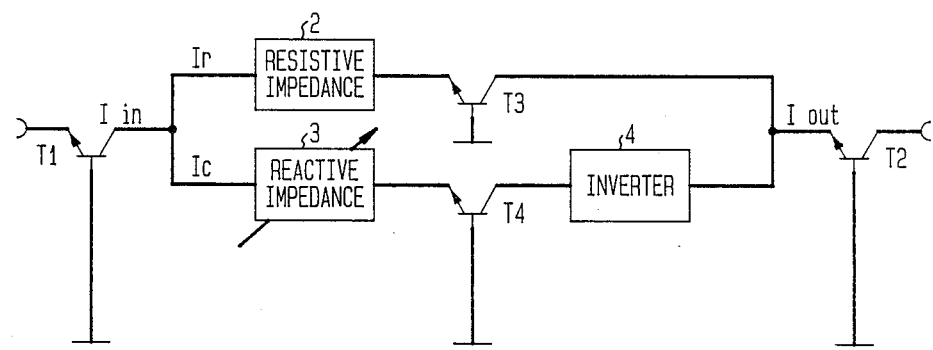
FIG. 11   FIG. 12   FIG. 13
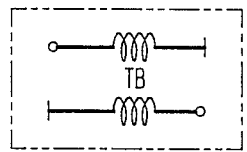
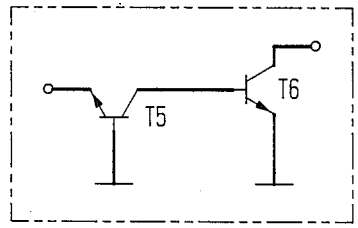
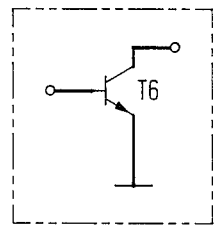

PHASE SHIFTER-EQUALIZER CIRCUIT

The present invention covers a constant amplitude phase shifter-equalizer circuit, which receives an input signal and supplies an output signal, including a first and a second branch, one of which includes a phase inverter device.

It is known that in the filtering circuits, for instance operating at an intermediate frequency (35, 70 or 140 MHz), the phase relationship between the output signal and the input signal is not constant versus operating frequency over a determined frequency band, but it varies in an undesired way and that, in order to obviate this drawback, circuits are used to compensate for the signal phase variation versus frequency, which are called phase equalizers circuits.

It is also known that in the series production of the circuits to be compensated for and the equalizer circuits, components are used which present some tolerances, consequently it is necessary that the phase equalizers include facilities to recover the said tolerances and consequently must be adjustable.

It is also known that either active or passive phase equalizers can be used. Passive phase equalizers feature some drawbacks: they introduce variations in the output signal amplitude which depend on the operating frequency, they introduce mismatchings, they need several adjustment facilities and are extremely critical. Active phase equalizers known so far do not introduce mismatchings in the circuit, but they result in an output signal attenuation or, in order to avoid this attenuation, they use amplifier stages which make the circuit more complicated and render it critical, and furthermore they need at least two adjustments. Therefore, the purpose of the present invention is to obviate the said drawbacks and to indicate a constant-amplitude unit-gain adjustable phase shifter equalizer circuit, i.e. such a circuit as not to introduce frequency-dependent amplitude variations in the signal and not to attenuate the output signal; not to create mismatchings in the circuit; to be implemented with a limited number of components, so as to minimize the cost of the materials, and to have one only adjustment necessary, so as to permit further savings in the production costs. The limited number of components and the one adjustment necessary also result in a substantial reduction in the circuit criticality.

In order to achieve the said purposes, the present invention refers to a constant amplitude phase shifter-equalizer circuit which receives an input signal and supplies an output signal, including a first and a second branch, one of which includes a phase inverter device, characterized by the fact that at least the former of the said branches includes a first adjustable impedance, which permits to adjust phase and group delay between the output signal and the input signal in a continuous way, and by the fact that the second of the said branches includes a second impedance, and the said first and second impedances permit to keep the amplitude of the output signal with respect to the amplitude of the input signal, versus phase and group delay variations, substantially equal and constant.

Further purposes and advantages of the present invention will appear clear from the following detailed description of a preferred form of implementation and from the drawings attached hereto, given at purely explanatory and not limitative purposes, in which:

FIG. 1 represents a schematic circuit diagram of a first implementation of the phase shifter-equalizer circuit object of the present invention, FIGS. 2a and 2b represent two vectorial diagrams of the electrical quantities involved in the phase shifter-equalizer circuit shown in FIG. 1, FIG. 3 represents a schematic circuit diagram of a second implementation of the phase shifter-equalizer circuit object of the present invention, FIGS. 4a and 4b represent two vectorial diagrams of the electrical quantities involved in the phase shifter-equalizer circuit shown in FIG. 3, FIGS. 5a, 6a, 7a and 8a represent the phase versus frequency characteristics of the circuits shown in FIGS. 1 and 3, FIGS. 5b, 6b, 7b and 8b represent the group delay versus frequency characteristics for the circuits shown in FIGS. 1 and 3, FIG. 9 represents a first circuit diagram of the phase shifter-equalizer circuit shown in FIG. 1, FIG. 10 represents a second circuit diagram of the phase shifter equalizer circuit shown in FIG. 1, and FIGS. 11, 12 and 13 represent practical implementations of a detail of FIG. 1.

With reference to FIG. 1, a current generator 1 supplies a current $I_{in}$. To current generator 1 are connected the input of a purely resistive impedance 2 and the input of a purely reactive impedance 3. To the output from the purely reactive impedance 3 is connected the input of an inverter device 4, whose output is connected to the output from resistive impedance 2. The output common to resistive impedance 2 and inverter device 4 makes up the circuit output, which supplies an output current $I_{out}$ into a nearly zero impedance.

To explain the operation of the circuit, let us start from the condition whereby resistive impedance 2 is made up of a fixed resistor R and reactive impedance is made up of a variable capacitor C. First of all, we shall now demonstrate that the amplitude of the input current $I_{in}$ and the output current $I_{out}$ are equal. The output current $I_{out}$ equals the vectorial sum between current $I_r$ flowing trough resistor R and current $I_c$ flowing through capacitor C, after a 180° phase shift provided by the inverter device 4, i.e. $I_{out}=I_r-I_c$. On the other hand, if G and jwC indicate the admittances of resistor R and capacitor C respectively and V indicates the voltage supplied by current generator 1, it is: $I_r=GV$ and $I_c=jwCV$, consequently $I_{out}=V \cdot (G-jwC)$; in summary, since $V=I_{in}/(G+jwC)$, it is $I_{out}=I_{in} \cdot (G-jwC)/(G+jwC)$. This relationship demonstrates that the modules of the quantities within brackets are equal nor they vary versus frequency variation nor resistance R or capacitance C variations. Consequently the amplitude of the output current $I_{out}$ equals the amplitude of the input current $I_{in}$ and this equality is valid versus frequency, resistance R and capacitance C variations. To explain how phase varies, let us refer to the diagram in FIG. 2a, in which current $I_r$ is in phase with voltage V, current $I_c$ is leading by 90° with respect to voltage V and input current $I_{in}$ is phase shifted by a certain angle $\alpha/2$, leading with respect to voltage V. The inverter device 4 phase shifts current $I_c$ by 180°, consequently output current $I_{out}$ is phase shifted by an angle $\alpha$ lagging with respect to input current $I_{in}$. Varying capacitance value C results in varying the phase shift between voltage V and input current $I_{in}$ and consequently between input current $I_{in}$ and output current $I_{out}$. For instance, when $C=\infty$, all the current flows through the reactive branch, consequently output current $I_{out}$ is phase shifted (lagging) by 180° with respect to input current $I_{in}$, whereas in correspondance to C=0 all the current flows through resistor R and the two currents are in phase.

Therefore, adjusting in a continuous way capacitance value C from 0 to ∞ results in varying proportionally the phase shift between output current $I_{out}$ and input current $I_{in}$ between 0° and 180° (lagging).

It is possible to keep capacitance C constant and make resistance R vary. While resistance R varies between 0 and ∞, the phase shift between output current $I_{out}$ and input current $I_{in}$ varies between 0° and 180° (lagging), that is to say the same results irrespective on whether capacitance C or resistance R is varied.

In a typical case whereby one desires a phase shift between output current $I_{out}$ and input current $I_{in}$ of 90°, it is enough to make the values of resistance R and of the module of capacitive reactance 1/wC equal. It can be easily demonstrated that the previous considerations also apply in the case that reactive impedance 3 is made up of an inductance L. The only difference is in that current $I_1$ which flows through inductor L, as the diagram in FIG. 2b shows it, is phase shifted by 90° (lagging) with respect to voltage V and consequently output current $I_{out}$ is phase shifted with respect to input current $I_{in}$ in the opposite direction (leading). If resistance R is kept fixed while inductance L is varied in a continuous way between ∞ and 0, the phase shift between output current $I_{out}$ and input current $I_{in}$ is adjusted in a proportional way between 0° and 180° (leading). If inductance L is kept fixed while resistance R is varied in a continuous way between 0 and ∞, the phase shift between output current $I_{out}$ and input current $I_{in}$ is adjusted between 0° and 180° (leading), i.e. in this case too varying resistance R or inductance L has the same effect.

Should reactive impedance 3 be made up of an inductance L and a capacitance C, the circuit will behave as an inductive or capacitive circuit depending on the actual values assumed by inductance L and capacitance C respectively, and consequently either of the two cases previously illustrated will apply. The advantage of this solution consists in that the phase shift between output current $I_{out}$ and input current $I_{in}$ can be adjusted in a continuous way between 180° lagging and 180° leading. FIG. 3, in which the same components and the same quantities as in FIG. 1 are indicated with the same numbers and the same symbols, differs from FIG. 1 in that resistive impedance 2 and reactive impedance 3 are exchanged between each other.

It can be easily demonstrated that in this case too the amplitude of output current $I_{out}$ equals the amplitude of input current $I_{in}$ and the said equality is valid versus frequency, resistive impedance 2 and reactive impedance 3 variations.

To explain how phase varies, let us consider a first case whereby resistive impedance 2 is made up of a resistor R and reactive impedance 3 is made up of capacitor C. Current $I_r$ flowing through resistor R, as the diagram in FIG. 4a shows it, is in phase with voltage V, current $I_c$ flowing through capacitor C is phase shifted by 90° (leading) with respect to voltage V and consequently input current $I_{in}$ is phase shifted by an angle $\alpha/2$ (leading) with respect to voltage V. The current flowing through resistor R is inverted by inverter device 4 and output current $I_{out}$ is consequently phase shifted by an angle (180°−α) leading with respect to input current $I_{in}$. By making resistance R or capacitance C vary between ∞ and 0, the phase shift between output current $I_{out}$ and input current $I_{in}$ varies between 0° and 180° (leading).

Let us consider a second case whereby resistive impedance 2 is made up of a resistance R and reactive impedance 3 is made up of an inductance L. The only difference with respect to the previous case, see diagram in FIG. 4b, is in that current $I_1$ flowing through inductor L is phase shifted by 90° (lagging) with respect to voltage V and consequently output current $I_{out}$ is phase shifted by an angle (180°−α) (lagging) with respect to input current $I_{in}$. By making resistance R vary between ∞ and 0 or inductance L between 0 and ∞, the phase shift between output current $I_{out}$ and input current $I_{in}$ is variable between 0° and 180° (lagging). Let us consider a third case whereby resistive impedance 2 is made up of a resistance R and reactive impedance 3 is made up of an inductance L and a capacitance C. Depending on the values actually assumed by inductance L and capacitance C respectively, the circuit will behave as a capacitive or inductive one, and consequently either of the previous cases will apply. The advantage achieved using this solution is in that the phase between output current $I_{out}$ and input current $I_{in}$ is variable in a continuous way between 180° (leading) and 180° (lagging).

We have examined so far the circuits shown in FIG. 1 and FIG. 3 versus variations of parameters of the individual components. Now, if one considers how the phase of the output signal varies with respect to the input signal versus frequency in the said circuit, the diagram in FIG. 5a applies to RC-type circuits having the inverter device 4 included in the reactive branch and the RL-type circuits having the inverter device 4 in the resistive branch; the diagram in FIG. 6a applies to the RC-type circuits having the inverter device 4 included in the resistive branch and the RL-type circuits having the inverter device 4 included in the reactive branch; the diagram in FIG. 7a applies to the RLC-type circuits having the inverter device 4 included in the resistive branch and finally the diagram in FIG. 8a applies to the RLC-type circuits having the inverter device included in the reactive branch. Let us now consider group delay τ in the same circuits: it is given by differentiating phase with respect to pulsation τ=dα/dw, and the diagrams in FIGS. 5b, 6b, 7b and 8b are valid for the various types of circuit. In the said diagrams, α identifies signal phase, τ identifies group delay, f identifies frequency, $f_0$ identifies the midband frequency and $f_1$ and $f_2$ identify the lower and upper limits of the frequency band respectively. If one looks at the diagram in FIGS. 5a to 8b, it can be noted that over a certain frequency band $f_1$-$f_2$ phase and group delay τ variations of the RC or RL type circuits are less than in the RLC type circuits. It follows from this observation that the RC type and RL type circuits can be more advantageously used as phase shifter circuits, i.e. in order to introduce phase variations for single frequency signals or narrow band signals or to perform fine adjustments, whereas RLC type circuits can be more advantageously used as group delay equalizer circuits, i.e. in order to compensate for group delay variations introduced by filtering circuits in wideband signals or to perform very wide adjustments.

FIG. 9, in which the same components and the same quantities in the previous figures are identified by the same numbers and the same symbols respectively, differs from fig.1 in that current generator 1 has been implemented by a common base transistor $T_1$ and the low output impedance has been implemented by a common base transistor $T_2$.

FIG. 10, in which the same components and the same quantities in the previous figures are identified by the same numbers and the same symbols respectively, differs from FIG. 9 in that two common base transistors $T_3$ and $T_4$ are included in the resistive and reactive branches. The function performed by transistor $T_4$ is to buffer reactive impedance 3 from inverter device 4 in order to decrease the effect of spurious capacitances and inductances, while transistor $T_3$ is inserted in order not to introduce different propagation times in the two branches of the circuit. It is evident that the circuits illustrated in FIGS. 9 and 10 are also valid for the diagram in FIG. 3.

FIG. 11 shows how the inverter device 4 can be implemented using a normal transformer T or a bifilar transformer $T_B$.

FIG. 12 shows how the inverter device 4 can be implemented by two transistors $T_5$ and $T_6$ in common base and common emitter configurations respectively.

Figure 5A:
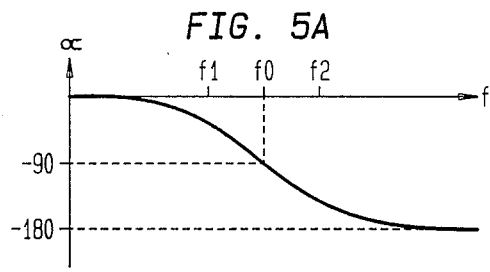
Figure 5B:
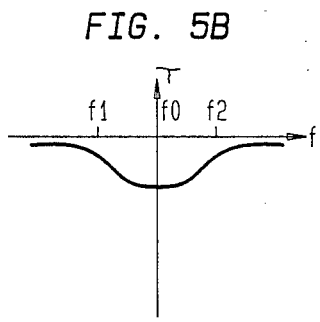
Figure 6A:
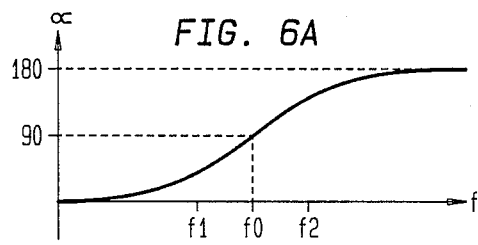
Figure 6B:
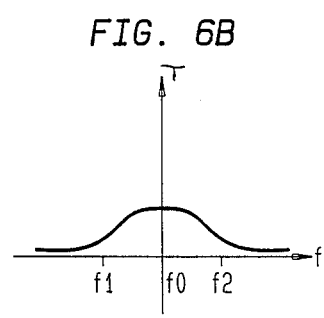
Figure 7A:
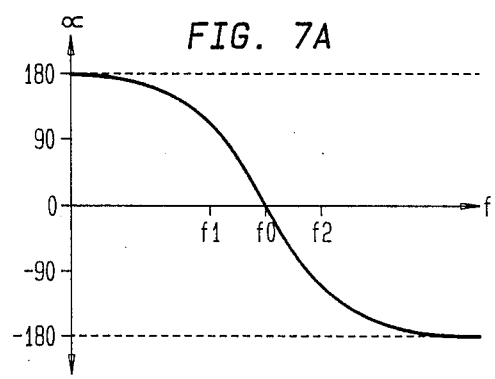
Figure 7B:
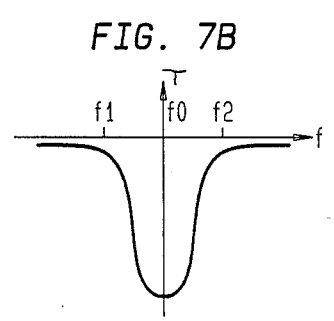
Figure 8A:
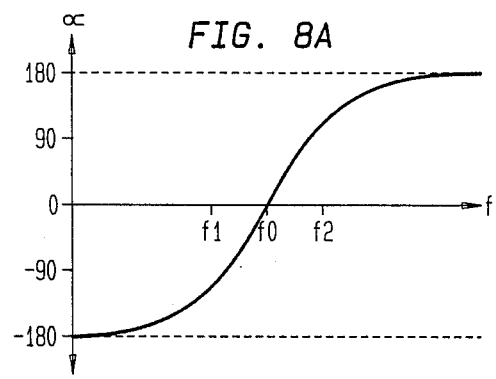
Figure 8B:
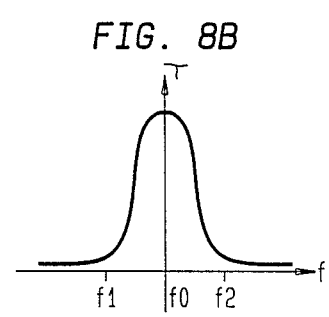

Finally, FIG. 13 shows how in the circuit shown in FIG. 10 the inverter device 4 is made up of transistor $T_6$ only, since the function of transistor $T_5$ is performed by transistor $T_4$.

In FIGS. 9, 10, 12 and 13 the biased circuits for the individual transistors are not described, since they are widely known.

The advantages of the phase shifter-equalizer circuit object of this invention are clear from the description made. In particular, these advantages are in that this circuit permits to adjust the phase of the output signal with respect to the input signal in a continuous way, while keeping amplitude constant and substantially equal to the amplitude of the input signals; in that it does not introduce any mismatching in the equalizer circuit; in that one only adjustment is sufficient; in that a limited number of components are necessary and consequently it is economical, reliable and little critical.

It is clear that numerous other modifications can be introduced in the phase shifter-equalizer circuit object of the present invention, without affecting the principles of novelty inherent to the inventive idea.

We claim:

1. Constant complitude phase-shifter equalizer circuit including an input terminal, coupled to an input node, and fed by an input current signal generator and an output node coupled to an output terminal, said circuit introducing a phase variation and a group delay between the input current signal and a current signal at the output terminal, and comprising:
   a first branch, coupled between said input and output nodes, including a series connection of a phase inverter device and a first impedance; and
   a second branch coupled between said input and output nodes, including a second impedance, wherein:
   said first impedance is an adjustable impedance for permitting continuous adjustment of the phase variation and group delay between current signals at said input and output terminals, is serially connected and is purely reactive, while the said second impedance is purely resistive.

2. Phase shifter-equalizer circuit according to claim 1, wherein said adjustable impedance includes at least one variable capacitance.

3. Phase shifter-equalizer circuit according to claim 1, wherein said adjustable impedance includes at least one variable inductance.

4. Phase shifter-equalizer circuit according to claim 1, wherein said first impedance is said adjustable impedance and includes at least one capacitance and at least one inductance, at least one of which is variable.

5. Constant amplitude phase-shifter equalizer circuit including an input terminal, coupled to an input node, and fed by an input current signal generator and an output node coupled to an output terminal, said circuit introducing a phase variation and a group delay between the input current signal and a current signal at the output terminal, and comprising:
   a first branch, coupled between said input and output nodes, including a series connection of a phase inverter device and a first impedance; and
   a second branch, coupled between said input and output nodes, including a second impedance, wherein:
   one of said first and second impedances is a serially connected purely reactive impedance which is adjustable for permitting continuous adjustment of the phase variation and group delay between current signals at said input and output terminals, and the other one of said first and second impedances is a purely resistive impedance.

6. Constant amplitude phase-shifter equalizer circuit including an input terminal, coupled to an input node, and fed by an input current signal generator and an output node coupled to an output terminal, said circuit introducing a phase variation and a group delay between the input current signal and a current signal at the output terminal, and comprising:
   a first branch, coupled between said input and output nodes, including a series connection of a phase inverter device and a first impedance; and
   a second branch, coupled between said input and output nodes, including a second impedance, wherein:
   said second impedance is an adjustable impedance for permitting continuous adjustment of the phase variation and group delay between current signals at said input and output terminals, is serially connected and is purely reactive, while said first impedance is purely resistive.

7. Phase shifter-equalizer circuit according to claim 6, wherein said adjustable impedance includes at least one variable capacitance.

8. Phase shifter-equalizer circuit according to claim 6, wherein said adjustable impedance includes at least one variable inductance.

9. Phase shifter-equalizer circuit according to claim 6, wherein said adjustable impedance includes at least one capacitance and at least one inductance, at least one of which is variable.

* * * * *